(12) United States Patent
Tashiro

(10) Patent No.: US 6,501,062 B2
(45) Date of Patent: Dec. 31, 2002

(54) IMAGE READING DEVICE AND RADIATION IMAGE PICK-UP APPARATUS

(75) Inventor: Kazuaki Tashiro, Hadano (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/334,651

(22) Filed: Jun. 17, 1999

(65) Prior Publication Data

US 2002/0109097 A1 Aug. 15, 2002

(30) Foreign Application Priority Data

Jun. 19, 1998 (JP) ............................................ 10-172808
Jun. 15, 1999 (JP) ............................................ 11-168387

(51) Int. Cl.⁷ ............................................... H01L 27/00
(52) U.S. Cl. ............................... 250/208.1; 250/370.09; 257/437

(58) Field of Search ............................... 250/208.1, 226, 250/370.11, 370.09; 257/437, 440; 378/62

(56) References Cited

U.S. PATENT DOCUMENTS

| 5,777,335 A | * | 7/1998 | Mochizuki et al. ..... 250/370.09 |
| 5,793,047 A | * | 8/1998 | Kobayashi et al. ..... 250/370.09 |
| 5,811,790 A | * | 9/1998 | Endo et al. ............... 250/208.1 |

FOREIGN PATENT DOCUMENTS

JP          9-298287          11/1997

\* cited by examiner

*Primary Examiner*—Que T. Le
*Assistant Examiner*—Thanh X. Luu
(74) *Attorney, Agent, or Firm*—Fitzpatrick, Cella, Harper & Scinto

(57) ABSTRACT

The image reading device of the present invention comprises a sensor substrate having at least a plurality of photosensors for photoelectric conversion of the light entered in the sensor substrate, wherein the sensor substrate is composed of a material capable of absorbing the light entered in the sensor substrate, thereby preventing formation of stray light which is caused by the reflection of the light entered in the sensor substrate at the surface of the sensor substrate or the back surface of a base member.

6 Claims, 13 Drawing Sheets

IMAGE READING DEVICE AND RADIATION IMAGE PICK-UP APPARATUS

BACKGROUND OF THE INVENTION

1. Field of the Invention

The present invention relates to an image reading device and a radiation image pick-up apparatus, and specifically to an image reading device comprising a sensor substrate having at least a plurality of photosensors for executing photoelectric conversion of the light entered in the sensor substrate and to a radiation image pick-up apparatus utilizing such image reading device. More specifically, it relates to an image reading device formed with a large-area process to enable a large area image reading, and a radiation image pick-up apparatus utilizing such image reading device.

2. Related Background Art

For reading information such as an image for example in an image reader, there are conventionally known a reading device employing a reduction optical system and a CCD sensor, and a reading device employing a television camera.

Also, based on the recent development of a semiconductor material for photoelectric conversion by utilizing a non-single-crystalline semiconductor represented by hydrogenated amorphous silicon, there is recently proposed an image reading device having a plurality of photosensors formed on a large-sized substrate by using this material which can read an image with a large area.

Besides, the non-single-crystalline semiconductor can be utilized not only as the photoelectric conversion semiconductor material of the photosensor but also as the semiconductor material of the thin film transistor. Therefore, signal processing portions can also be formed on the large-sized substrate together with the photosensors. Furthermore, the photoelectric conversion semiconductor layer of the photosensor and the semiconductor layer of the thin film transistor can be composed of the same layer.

Furthermore, in case of forming a capacitance element such as a capacitor on the same substrate, a semiconductor layer may be interposed between the opposed electrodes if they are mutually insulated. Based on this fact, it is possible to make common the order of deposition for the films constituting the photosensor, the films constituting the thin film transistor and the films constituting the capacitance element, and the films constituting each element can therefore be made common.

It was therefore rendered possible to produce the image reading device with a large area at a low cost.

As another application of such large-area image reading device, there is also conceived a device for converting a radiation image into a visible image by a fluorescent plate which emits visible light by absorbing a radiation such as X-ray, and reading such visible image. A compact X-ray image pick-up apparatus of high performance is being realized by incorporating such image reading device thereto.

In Japanese Patent Application Laid-Open No. 9-298287 the present inventor has proposed one of the above-mentioned image reading devices.

FIG. 13A is a plan view of one pixel of the image reading device proposed by the present inventor, and FIG. 13B is a cross-sectional view taken along the line 13B—13B in FIG. 13A. Also, FIG. 14 is an equivalent circuit diagram of one pixel of this image reading device.

One pixel is composed of a MIS photosensor S11, and a driving thin film transistor T11 serving as the driving portion of the photosensor. These drawings show a signal wiring SIG, a gate line gn of the driving thin film transistor T11, the upper electrode S and lower electrode G of the MIS sensor, and capacitances Cgs and Cgd respectively formed by overlapping the gate electrode with the source electrode and by overlapping the gate electrode with the drain electrode. Charges generated in the MIS photosensor S11 by light are accumulated in the capacitances Cgs and Cgd through the thin film transistor T11, and are then read by a reading circuit not shown in the drawings. Though the above is limited to one bit, but in the fact the capacitances Cgs and Cgd are the sum of capacitances connected to other transistors, respectively. Thus the accumulation capacitances utilize Cgs and Cgd.

FIGS. 15A and 15B are energy band illustrations Qf the photosensor showing the operations in a refreshing mode and a photoelectric conversion mode, respectively, wherein numerals 1 to 5 indicate each layer in the thickness direction thereof. In FIG. 15A showing the refreshing mode, the electrode S is given a negative potential with respect to the electrode G, whereby holes represented by black circles (●) in a hydrogenated amorphous silicon layer 3 are guided to the electrode S by the electric field. At the same time, electrons represented by open circles (○) are injected into the hydrogenated amorphous silicon layer 3. In this time, a part of the holes and a part of the electrons recombine and vanish in an $N^+$ hydrogenated amorphous silicon layer 2 and the hydrogenated amorphous silicon layer 3. If this state continues for a sufficiently long time, the holes in the hydrogenated amorphous silicon layer 3 are removed from the hydrogenated amorphous silicon layer 3. When next state becomes a state of the photoelectric conversion mode shown in FIG. 15B, the electrode S is given a positive potential with respect to the electrode G, whereby the electrons in the hydrogenated amorphous silicon layer 3 are instantaneously guided to the electrode S. However, the holes are not guided to the hydrogenated amorphous silicon layer 3 because the $N^+$ hydrogenated amorphous silicon layer 2 functions as an injection inhibiting layer. When light enters the hydrogenated amorphous silicon layer 3 in this state, the light is absorbed and electron-hole pairs are generated. The electrons are guided to the electrode by the electric field, while the holes move in the hydrogenated amorphous silicon layer 3 and reach the interface of a hydrogenated amorphous silicon nitride layer 4 but are stopped at the interface and remain in the hydrogenated amorphous silicon layer 3. As the electrons move to the electrode S while the holes move in the hydrogenated amorphous silicon layer 3 to the interface with the hydrogenated amorphous silicon nitride layer 4, a current flows from the electrode G in order to maintain the electrical neutrality in the device. This current corresponding. to the electron-hole pairs generated by the light is proportional to the incident light.

FIG. 16 shows the entire circuit of the image reading device. Photosensors and thin film transistors for driving the photosensors can be formed on the same substrate by the same process. In the circuit diagram there are shown photosensors S11 to S33, thin film transistors T11 to T33 for driving the photosensors, a reading power source Vs and a refreshing power source Vg connected, respectively through switches SWs and SWg, to the lower electrode G of all the photosensors S11 to S33. The switch SWs is connected through an inverter to a refreshing control circuit RF while the switch SWg is connected directly to the refreshing control circuit RF. The switch SWg is turned on during the refreshing period while the switch SWs is turned on during other periods. The output signal is supplied by a signal wiring SIG to a detecting integrated circuit IC.

In the circuit shown in FIG. 16, nine pixels are divided into three blocks, and the outputs of three pixels in each block are transferred simultaneously and signals are successively converted into outputs by the detecting integrated circuit. For the purpose of simplicity, there is illustrated a two-dimensional image input portion of nine pixels but there are in practice provided a larger number of pixels in a high density. As an example, in case an image reading device of 40×40 cm is formed with pixels of a size of 150×150 μm, there are provided approximately 1.8 million pixels.

FIG. 17 schematically shows an X-ray image reading device formed by combining the above-described image reading device with a fluorescent plate, and an X-ray image pick-up apparatus utilizing such image reading. device.

X-ray emitted from an X-ray source 1701 hits an object 1702, and a part thereof enters an image reading device 1705 as the transmitted light, while another part enters the image reading device as the scattered X-ray. A grid 1703 removes the scattered X-ray from the object. Substantially only the transmitted light enters the fluorescent plate 1708, is absorbed therein and is converted into visible light depending on the intensity. This visible light enters the photosensors as an image of 1× magnification, and is incorporated as an image. There are also shown a sensor substrate 1704, a case 1706 for the image reading unit, and an image reading unit 1707.

The problems of the conventional image reading device described above will be explained by referring to an image reading device for the X-ray image pick-up apparatus.

In use of the fluorescent plate mainly composed of $Gd_2O_2S:Tl^{3+}$ having a high light emitting efficiency, when X-ray enters this fluorescent plate, the light emitted from the plate has a green light having a wavelength of λ=550 nm with the largest intensity.

The light emitted from the fluorescent plate reaches the sensor substrate while it is scattered, is detected by the photosensors and is outputed as image signals to the outside.

However, in the conventional image reading device in which the photosensors and thin film transistors are generally formed on a transparent insulating substrate such as a glass substrate, the light entered in the interior of the substrate through the gap between the pixels is reflected on the back surface of the substrate because it is transparent, thereby generating stray light and degrading the sharpness of the image reading device.

More specifically, the back surface of the sensor substrate is in contact with the air in an extreme position, thereby showing a large difference in the refractive index. Generally, the light entering in an interface between layers having difference refractive indexes is reflected in a proportion corresponding to the difference in the refractive index. The reflective coefficient R of the reflected light in case of a normal reflection is represented by:

$$R=(n1-n2)/(n1+n2)$$

wherein n2 is the refractive index of air and n1 is the reflective index of the sensor substrate.

The reflection intensity is proportional to $R^2$. In case the sensor substrate is composed of glass, n1=1.5, and, for n2=1.0, there is obtained R=0.2 and $R^2$=0.04 so that 4% of light is reflected at the interface.

The actual system includes not only the normal reflection but also the light obliquely entering the interface, and the reflectance for such light becomes larger than the normal reflectance. Also under the condition of total reflection, the incident light is reflected by almost 100%.

Consequently the light entering the interior of the substrate from the surface thereof with an angle reaches the back surface of the substrate, on which at least a part of such light is reflected and is absorbed by the adjacent pixels to generate optical crosstalk, which causes degradation of the sharpness of the image reading device.

SUMMARY OF THE INVENTION

The first image reading device of the present invention comprises a sensor substrate having at least a plurality of photosensors for photoelectric conversion of the light entered in the sensor substrate, wherein the sensor substrate is composed of a material capable of absorbing the light entered in the sensor substrate.

The second image reading device of the present invention comprises a sensor substrate having at least a plurality of photosensors and a base member adhered to the sensor substrate via an adhesive layer, wherein the base member is composed of a material capable of absorbing the light entered from the sensor substrate.

The third image reading device of the present invention comprises a sensor substrate having at least a plurality of photosensors and a base member adhered to the sensor substrate via an adhesive layer, wherein the base member has a layer of a material capable of absorbing an entering light on the surface of the base member at the side of the sensor substrate.

The fourth image reading device of the present invention comprises a sensor substrate having at least a plurality of photosensors and a base member adhered to the sensor substrate via an adhesive layer, wherein the base member has a layer of a material capable of absorbing an entering light on the surface of the base member at the side opposite to the side of the sensor substrate.

The fifth image reading device of the present invention is the above-mentioned second image reading device, provided that the sensor substrate, the adhesive layer and the base member have substantially the same refractive index (including the same refractive index).

The sixth image reading device of the present invention is the above-mentioned third image reading device, provided that the sensor substrate, the adhesive layer and the layer of the material capable of absorbing the entering light have substantially the same refractive index (including the same refractive index).

The seventh image reading device of the present invention is the above-mentioned fourth image reading device, provided that the sensor substrate, the adhesive layer, the base member and the layer of the material capable of absorbing the entering light have substantially the same refractive index (including the refractive index).

The eighth image reading device of the present invention is any one of the above-mentioned first to seventh image reading devices, provided that:

the photosensor is formed by stacking a first electrode layer, a first insulating layer for inhibiting the passage of carriers of a first conductivity type and carriers of a second conductivity type different from the first conductivity type, a photoelectric conversion semiconductor layer, a second electrode layer, and an injection inhibiting layer for inhibiting injection of the carriers of the first conductivity type into the photoelectric conversion semiconductor layer, the injection inhibiting layer being provided between the second electrode layer and the photoelectric conversion semiconductor layer;

switching means to be respectively connected to the photosensors are formed on the sensor substrate together with the photosensors;

the switching means in a refreshing operation provide the photosensors with an electric field in a direction of guiding the carriers of the first conductivity type from the photoelectric conversion semiconductor layer to the second electrode layer, and the switching means in a photoelectric conversion operation provide the photosensors with an electric field in a direction of retaining the carriers of the first conductivity type generated by the light entering the photoelectric conversion semiconductor layer in the photoelectric conversion semiconductor layer and guiding the carriers of the second conductivity type to the second electrode layer, the switching means being controlled in the photoelectric conversion operation so as to detect, as optical signals, the carriers of the first conductivity type accumulated in the photoelectric conversion semiconductor layer or the carriers of the second conductivity type guided to the second electrode layer; and the plurality of photosensors are arranged two-dimensionally and are divided into a plurality of blocks, and the switching means are operated for each block to detect the optical signals.

Also the radiation image pick-up apparatus of the present invention utilizes any one of the above-mentioned first to eighth image reading devices.

BRIEF DESCRIPTION OF THE DRAWINGS

FIGS. 2A and 2B are views showing an experimental system for confirming the effect of the present invention in Example 1, wherein FIG. 2A is a view showing a non-colored member and FIG. 2B is a view showing a colored member;

DESCRIPTION OF THE PREFERRED EMBODIMENTS

The aforementioned problem results from the presence of an interface between the sensor substrate and the air. Therefore, the above-mentioned problem can be solved by eliminating such interface, because the reflection at the interface is eliminated. The present inventors have therefore investigated various configurations and have found a configuration which allows to substantially eliminate such interface. More specifically, if the light entering the sensor substrate can vanish by absorption before reaching the interface, the interface becomes substantially absent for such entering light, so that the reflection does not take place and the above-mentioned problem can be solved.

In the following, the present invention for realizing the above principle will be explained in detail, with reference to the attached drawings. The image reading device of the present invention is advantageously applied to the image reading device for an X-ray image pick-up apparatus. However, the application of the image reading device of the present invention is not limited to the X-ray image pick-up apparatus, and it is possible to also apply the image reading device of the present invention to the radiation image pick-up apparatus utilizing α-ray, β-ray or γ-ray other than X-ray.

EXAMPLE 1

Figure 1:
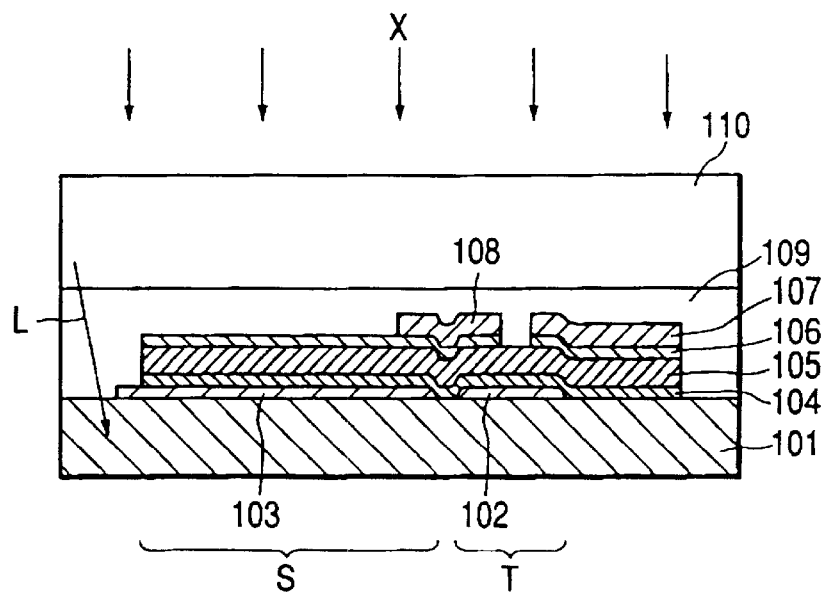
FIG. 1 is a cross-sectional view showing Example 1 of the present invention.

FIG. 1 is a cross-sectional view of an image reading device of the present invention, for use in an X-ray image pick-up apparatus.

The image reading device for X-ray image pick-up apparatus as shown in FIG. 1 is an image reading device including a sensor substrate having a photosensor S, a thin film transistor T and the like. Reference numeral 101 indicates the sensor substrate; 102, a gate electrode; 103, a first electrode; 104, a gate insulating film; 105, a semiconductor layer; 106, an impurity layer; 107, a drain electrode; 108, a source electrode; 109, a passivation layer; 110, a fluorescent plate; X, X-ray.

A radiation X (X-ray in this case) is detected by the combination of a fluorescent plate 110 and a photosensor S. The X-ray X entered from the exterior to the fluorescent plate is converted therein into the light of a wavelength region (visible light in this case) detectable with the photosensor. The light reaches the photosensor in the size of 1× magnification and is converted by the photosensor into a photocurrent. In the present example, the sensor substrate 101 is composed of a colored glass. The fluorescent plate 110 in the present example was mainly composed of $Gd_2O_2S:Tl^{3+}$, and the emitted light included the light with the largest intensity which was the green light of a wavelength λ=550 nm. In the present example, therefore, the image reading device was produced by employing a red-colored glass substrate and forming photosensors, thin film transistors, capacitance elements and the like. thereon. The method of producing the image reading device is basically same as that in the conventional method as explained in the foregoing.

The glass was composed of an ordinary glass material colored with Au, Cu, Se or Cd (S, Se), but such coloring elements did not have any adverse effect on the elements formed on the colored glass.

Figure 2A:
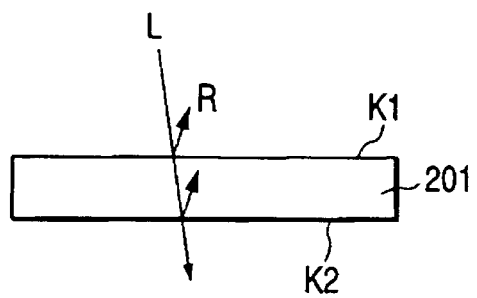
Figure 2B:
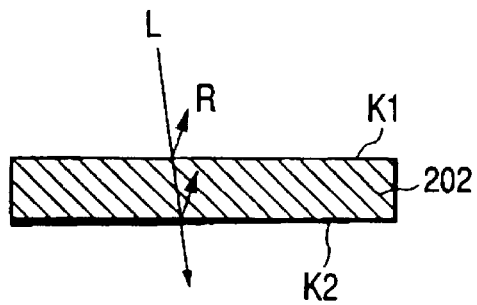

FIGS. 2A and 2B schematically show the experiments conducted for confirming the effect of the present invention, wherein FIG. 2A shows a case of employing an ordinary glass plate while FIG. 2B shows a case of employing a red-colored glass plate as in the present example. The refractive index of the glass substrate was set as 1.5 in both cases. The effect was confirmed by measuring the spectral sensitivity of the magnitude of the normal reflectance of light on the red-colored glass 202 and the ordinary glass 201 with respect to the incident light. In case of the ordinary glass, the light reflection takes place at the first interface K1 and the second interface K2 as shown in FIG. 2A. More specifically, the incident light L is at first reflected at the first interface K1, and a part of the incident light is further reflected at the second interface K2.

Figure 3:
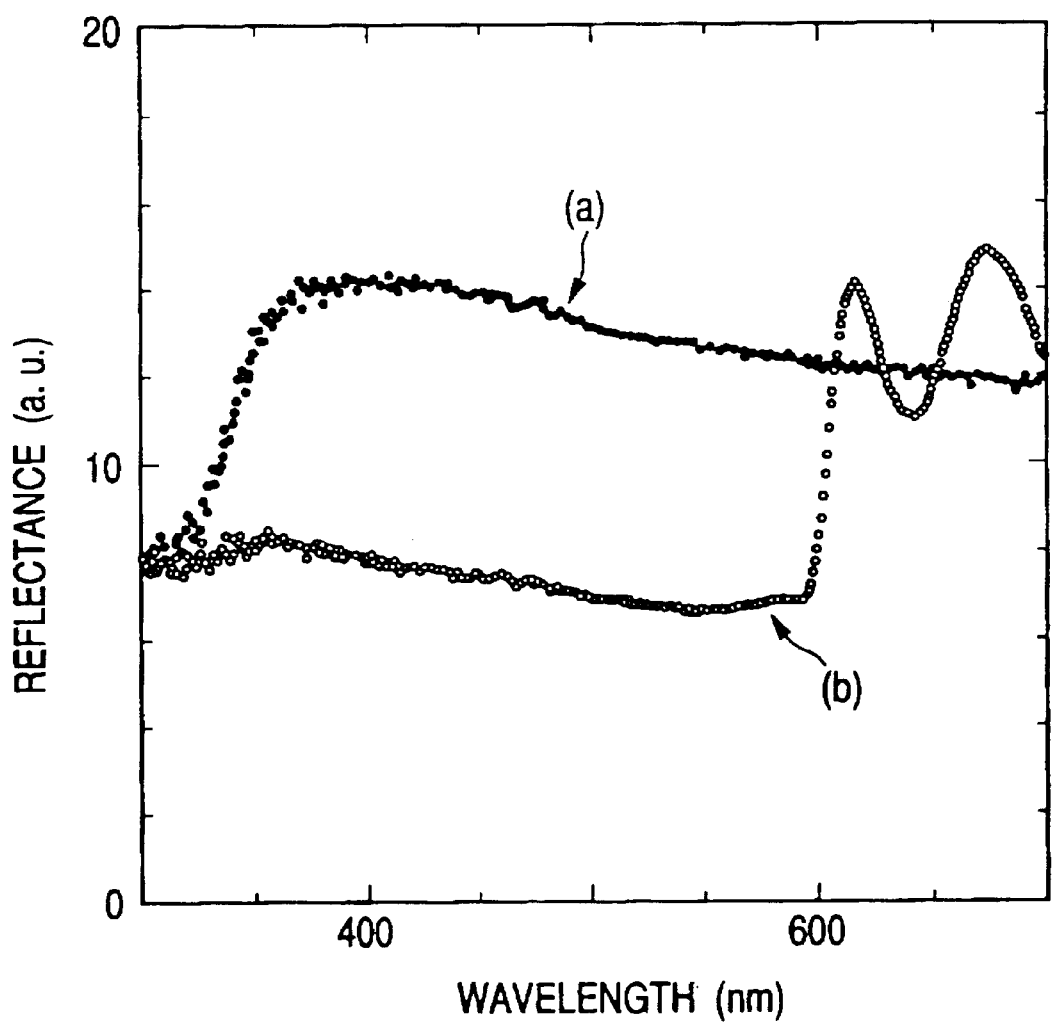
FIG. 3 is a reflectance-wavelength characteristic graph showing the results in the experimental systems shown in FIGS. 2A and 2B.

FIG. 3 is a reflectance-wavelength characteristic graph, in which black circles (a) show the characteristics in use of the ordinary glass. As shown by black circles (a), the reflectance remains almost flat from about 700 nm to 350 nm, but decreases to about a half starting from about 350 nm. This is because the glass substrate starts to absorb light from about 350 nm and is almost opaque at about 300 nm. Therefore, the light in this wavelength region does not reach the second interface K2, so that the reflection does not take place at the second interface but only at the first interface.

On the other hand, in use of the red-colored glass substrate opaque to the green light, the reflection at the second interface K2 is substantially suppressed from about 600 nm, as shown by open circles (b) in FIG. 3.

As be apparent from the foregoing experiments, in case of employing the red-colored glass substrate, the green light having the peak at 550 nm is absorbed in the substrate before reaching the second interface K2.

Therefore, in the present example employing the red-colored glass substrate for the sensor substrate, the green light having the peak at 550 nm and entering the sensor substrate is absorbed within the substrate before reaching the second interface K2, so that the reflection at the second interface K2 does not take place.

Consequently there can be attained the object of the present invention of substantially eliminating the reflection at the second interface K2 in the wavelength region sensitive to the photosensor.

Figure 4:
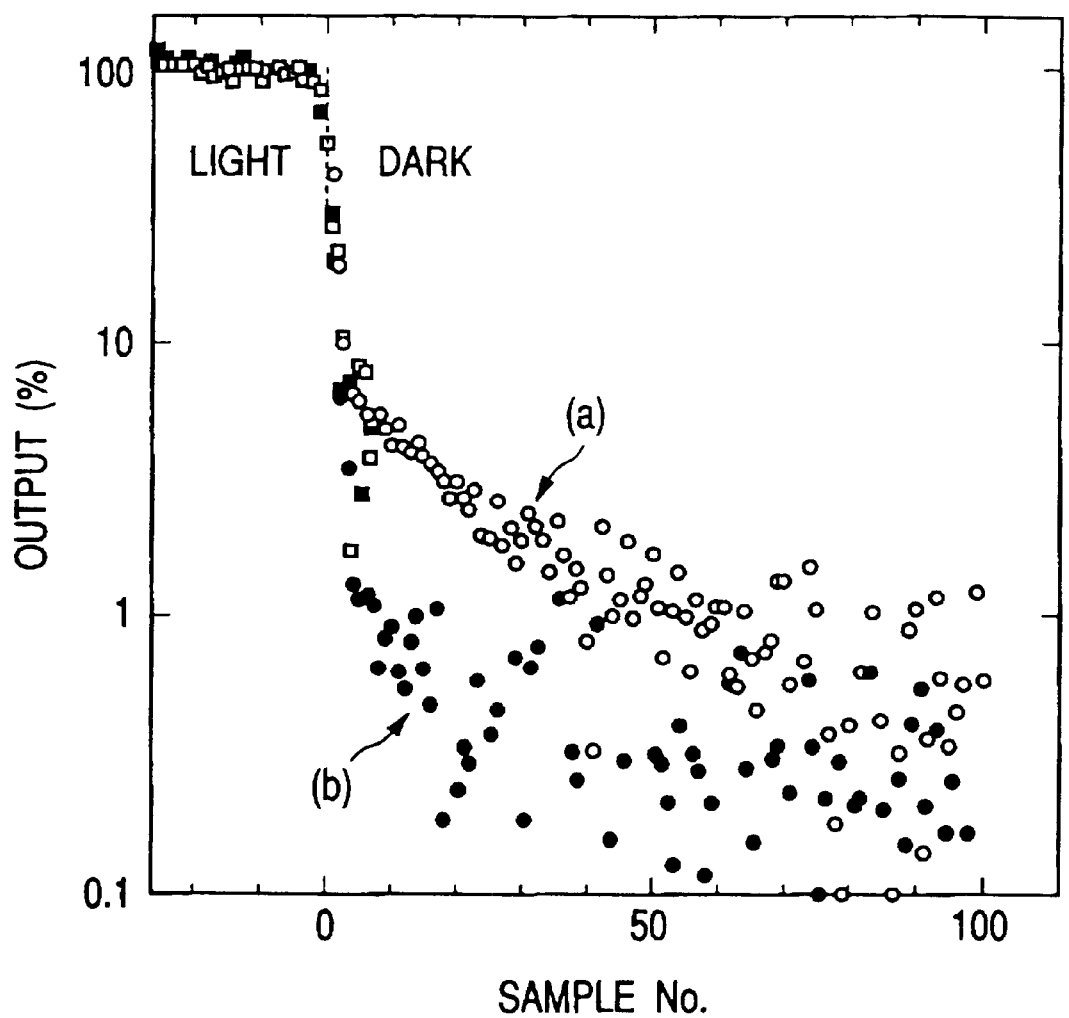
FIG. 4 is a characteristic graph showing the optical crosstalk in the image reading device of Example 1 of the present invention.

The optical crosstalk was compared by employing the substrate of the present example in the actual image reading device. A light shielding mask was placed on a part of the image reading device, and the sensor outputs in the pixels receiving the light ("LIGHT" region in FIG. 4) and the pixels not receiving the light ("DARK" region in FIG. 4) were compared by taking the pixel position in the axis of abscissa in FIG. 4. In FIG. 4, sample No. 0 corresponds to the pixel under the end of the light shielding mask and sample Nos. 1 to 100 correspond to pixels under the light shielding mask. In FIG. 4, open symbols (a) show the distribution of results (represented by open squares and open circles) of the conventional image reading device (employing the ordinary glass substrate). The results indicate that the light spreads over the region of 60 to 70 pixels with an output not larger than 1%. On the other hand, in the device of the present example, as indicated by the distribution of black symbols (b) (represented by black squares and black circles), the light spreading is reduced and the output is lowered to 1% or less within about 10 pixels.

As a result, the image reading device of excellent sharpness could be obtained by the present example.

Also in the present example, because all the light is absorbed in the sensor substrate, it is no longer necessary to consider, even in case of mounting the sensor substrate on a base member as described in the following examples, the optical influence of such base member or the adhesive material for adhering the sensor substrate and the base member, so that the freedom of designing can be increased.

The present example employs the red-colored glass substrate because the fluorescent plate emits green light, but such color is not restrictive. There can be employed any material for the substrate as long as it matches the process for forming the photosensors and the like and it has a color complementary to the color of the light emitted by the fluorescent plate. For example, the effect of the present invention can be sufficiently exhibited with black-colored heat-resistant plastic material.

Also in the manufacturing process, the substrate itself serves as a light absorbing material, so that there is not required a step of reducing the stray light and the image reading device of a large area can be obtained without reducing the production yield by properly managing the substrate.

EXAMPLE 2

Figure 5A:
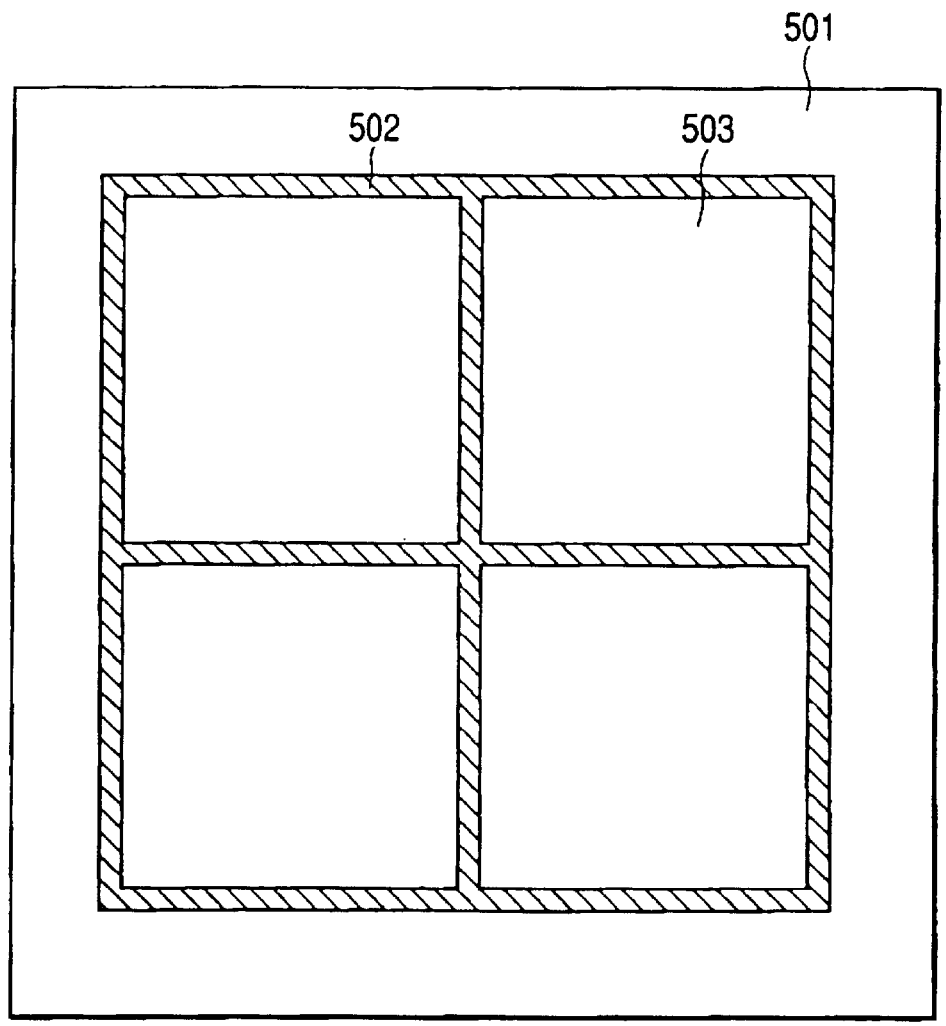
FIGS. 5A and 5B are respectively a plan view and a cross-sectional view of Example 2 of the present invention.
Figure 5B:
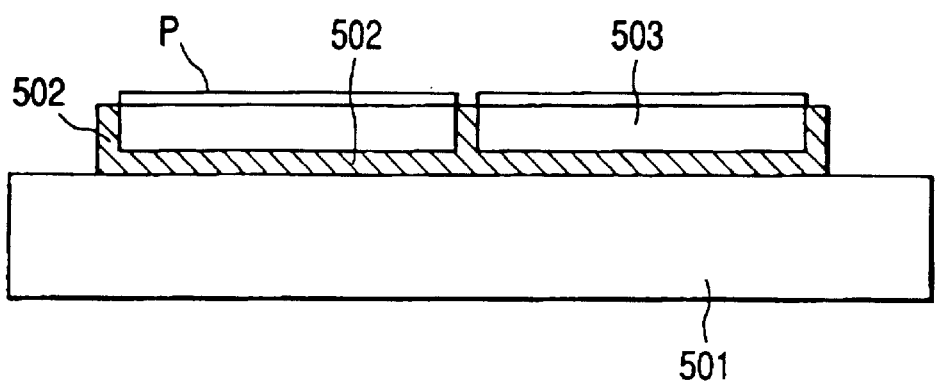

FIG. 5A is a schematic plan view of an image reading device of the present invention for use in an X-ray image pick-up apparatus, and FIG. 5B is a cross-sectional view of the device of FIG. 5A.

As be apparent from FIGS. 5A and 5B, in the present example, the image reading device of a large area is produced by placing a plurality of sensor substrates 503 (four substrates in the present case) on the same base member 501, which is composed of a low-alkali colored glass. The sensor substrate 503 has almost the same structure as that of the image reading device for X-ray image pick-up apparatus as described in Example 1 referring to FIG. 1 and corresponds to the sensor substrate 101 in FIG. 1.

Similarly to Example 1, radiation (X-ray in the present case) is detected by the combination of a fluorescent plate and a photosensor. The X-ray entered from the exterior to the fluorescent plate is converted therein into light of a wavelength region (visible light in the present case) detectable by the photosensor. This light reaches the photosensor in the size of 1× magnification and is converted in the photosensor into a photocurrent.

The sensor substrate 503 was composed of low-alkali glass with a refractive index of 1.5. The sensor substrate 503 and the base member 501 were adhered with an epoxy-based adhesive 502. The epoxy resin after curing had a refractive index of 1.4 to 1.6, which is almost the same as that of the sensor substrate. The base member 501 was composed of colored low-alkali glass having the same refractive index as that of the sensor substrate 503.

The fluorescent plate P provided on the sensor substrate was mainly composed of $Gd_2O_2S:Tl^{3+}$ which emitted the green light of a wavelength λ=550 nm. In the present example, the image reading device was produced by employing a red-colored glass plate as the base member and by adhering glass plates having photosensors, thin film transistors, capacitance elements and the like, that is, the sensor substrate 503 on the base member with the above-mentioned adhesive.

The same colored glass as that used in Example 1 was used as the base member, and also in the present example the coloring elements employed in the glass as the base did not show any adverse effects on the elements provided on the sensor substrates.

Figure 8A:
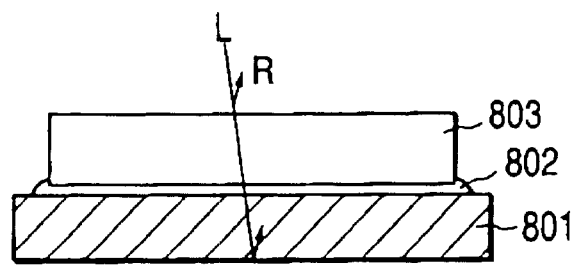
FIGS. 8A, 8B and 8C are schematic views showing experimental systems for confirming the effect of the present invention respectively in Examples 2, 3 and 4 of the present invention.

Similarly to Example 1, FIG. 8A schematically shows the experiment conducted for confirming the effect of the present invention. The glass substrate 803 also had a refractive index of 1.5. The total reflection at the light incident side was measured on a red-colored glass substrate 801 and an ordinary glass 803 mutually adhered with epoxy resin 802, and on an ordinary glass substrate 801' (not shown) and an ordinary glass 803 mutually adhered with the epoxy resin 802, and the effect was confirmed by measuring the spectral sensitivity of a magnitude of the normal reflectance of light with respect to the incident light.

The sensor substrate 803, adhesive 802 and base member 801 (or 801') which have almost the same refractive index are optically substantially uniform, so that the light entering in the sensor substrate is transmitted through the adhesive and enters the base member 801 (or 801').

Figure 9:
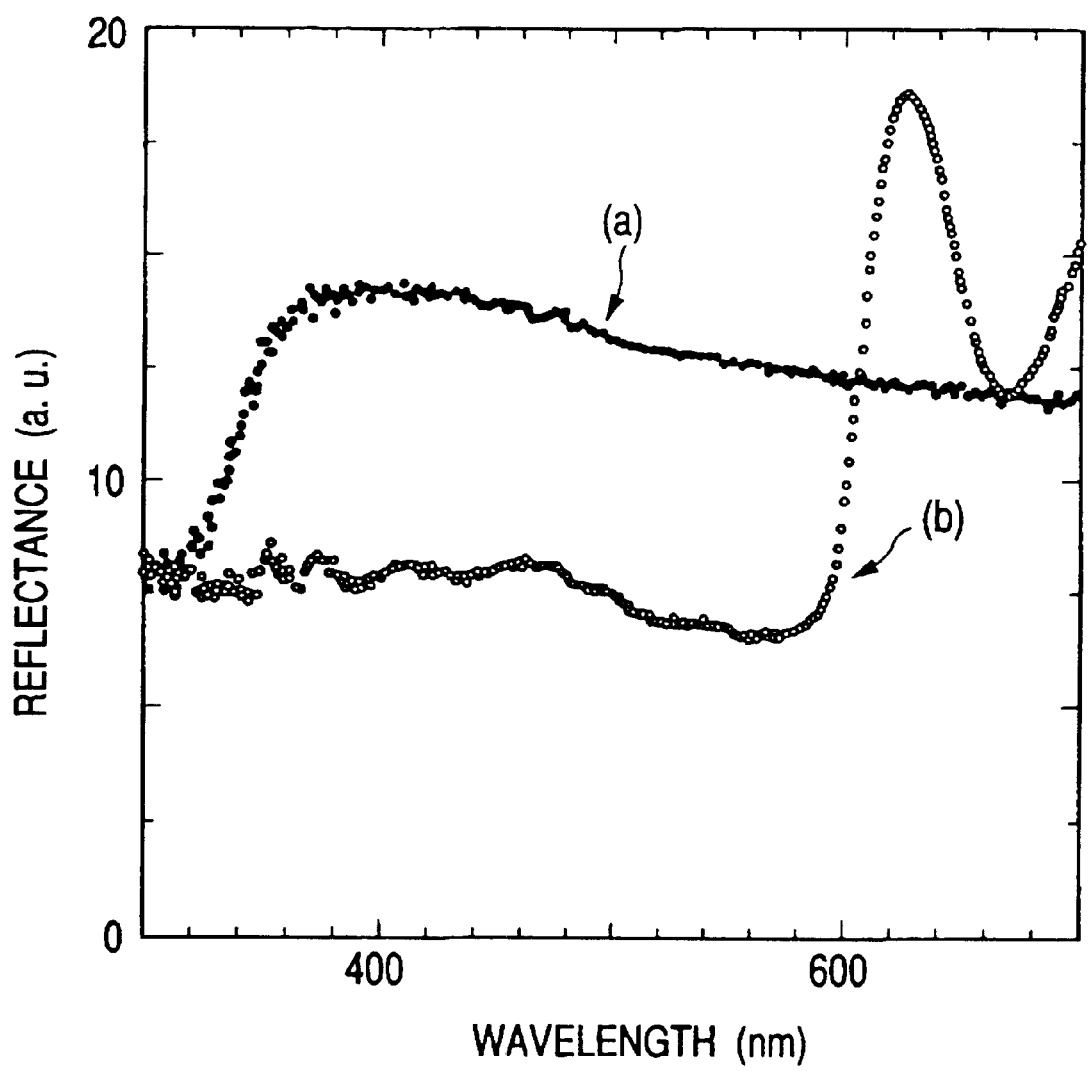
FIG. 9 is a reflectance-wavelength characteristic graph showing the result in the experimental system in FIG. 8A.

In the conventional configuration (with the ordinary glass), the reflected light takes place at the first interface on the surface of the sensor substrate 803 and at the second interface on the back surface of the base member 801'. Therefore, when the light enters, it is reflected at the first interface, and a part of the incident light is further reflected at the second interface. In FIG. 9, black circles (a) indicate the reflectance-wavelength characteristics in case the ordinary glass is employed as the base member.

On the other hand, in case the base member 801 is colored red for absorbing the green light, the light entering the base member 801 is absorbed therein before reaching the back surface thereof. As a result, as indicated by open circles (b) in FIG. 9, the reflectance at the back interface is substantially lowered from about 600 nm to a low wavelength region side, particularly around 550 nm.

In the present example, because the base member is composed of red-colored glass plate, the green light having the peak at 550 nm and entering in the sensor substrate is absorbed within the base member before reaching the second interface of the base member, so that the reflection does not take place at the second interface.

Consequently there can be attained the object of the present invention of substantially eliminating the reflection at the second interface in the wavelength region sensitive to the photosensor.

Figure 12:
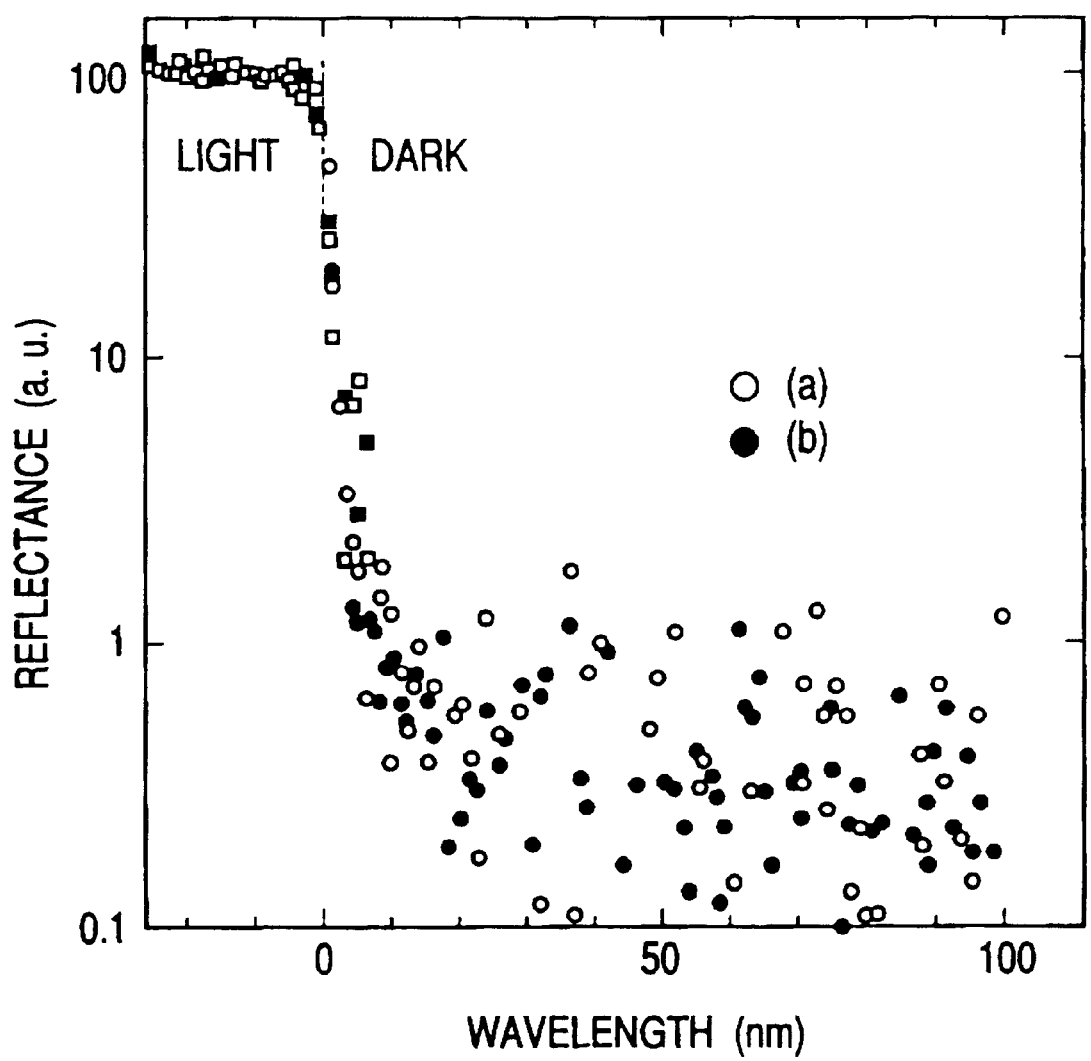
FIG. 12 is a characteristic graph of the optical crosstalk showing the comparison of the effect of the present invention in the image reading devices of Examples 1 and 2.
Figure 13A:
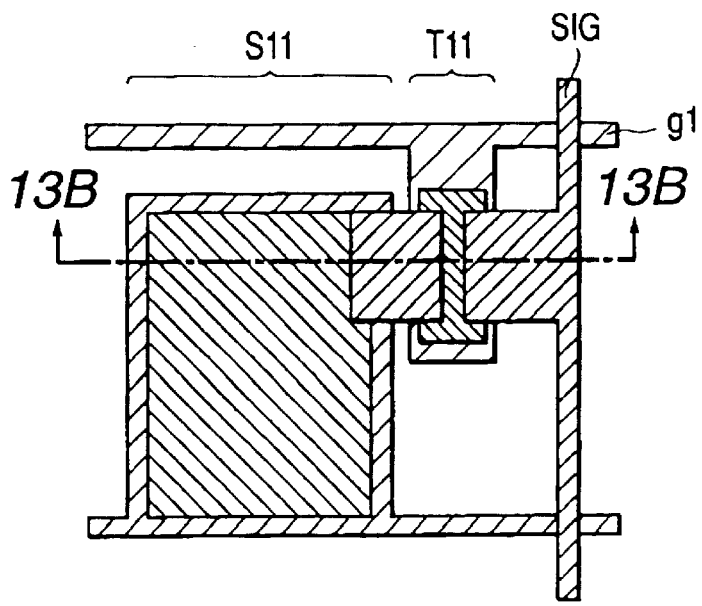
FIG. 13A is a plan view of one pixel of a conventional image reading device.
Figure 13B:
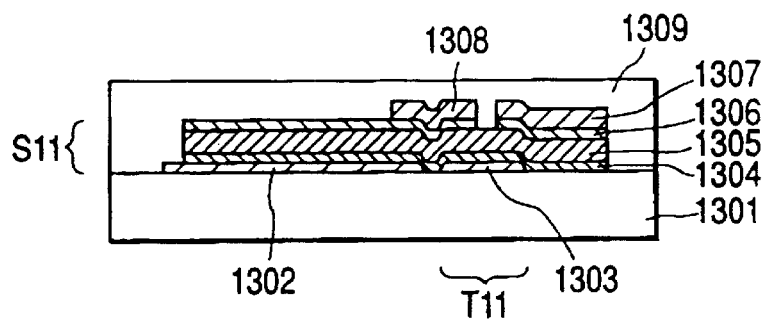
FIG. 13B is a cross-sectional view taken along the line 13B—13B in FIG. 13A.
Figure 14:
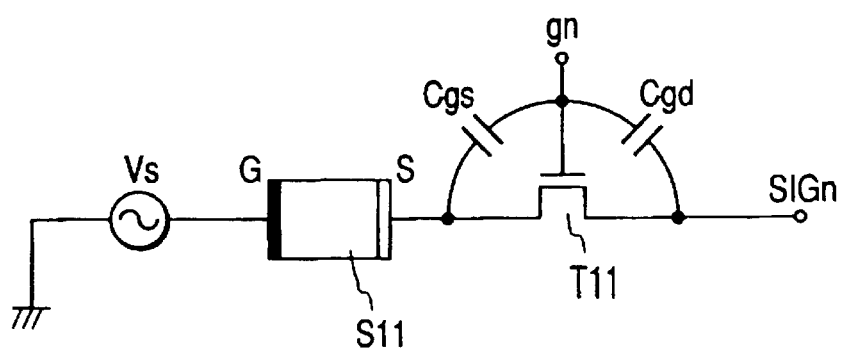
FIG. 14 is an equivalent circuit diagram of one pixel of a conventional image reading device.
Figure 15A:
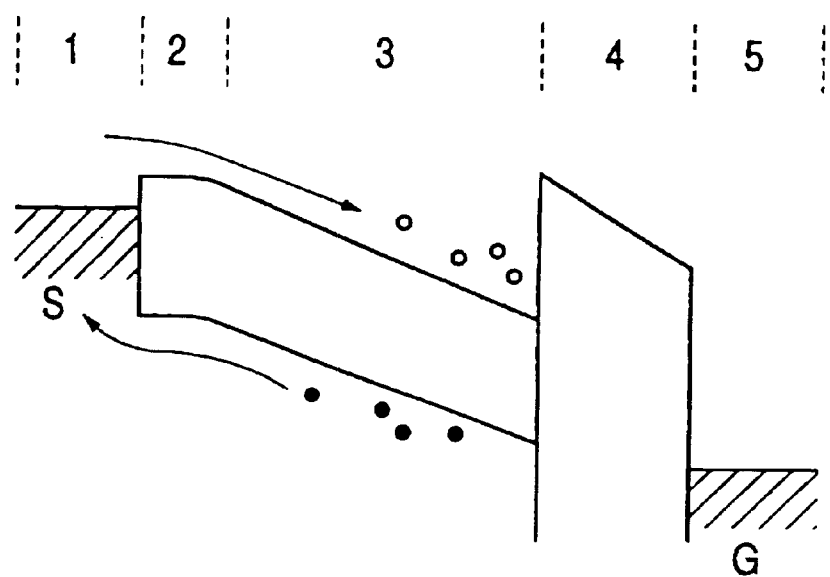
FIGS. 15A and 15B are energy band diagrams showing the operation principle of a conventional image reading device and an image reading device of the present invention, respectively.
Figure 15B:
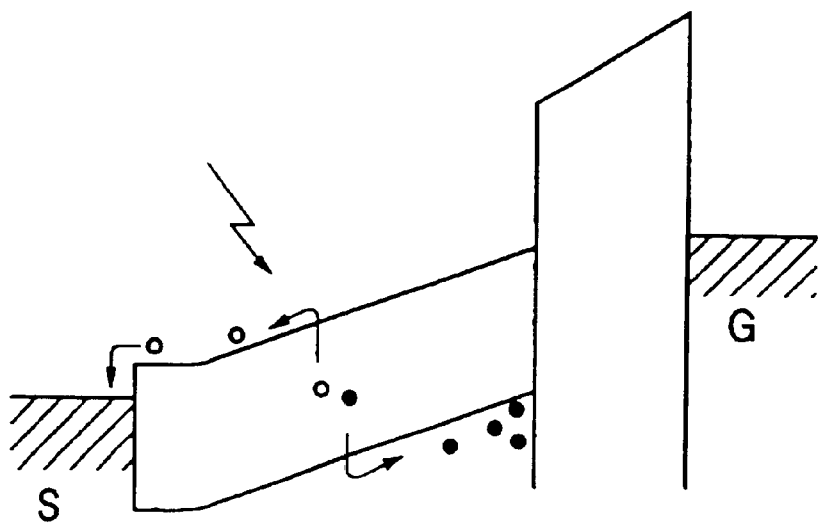
Figure 16:
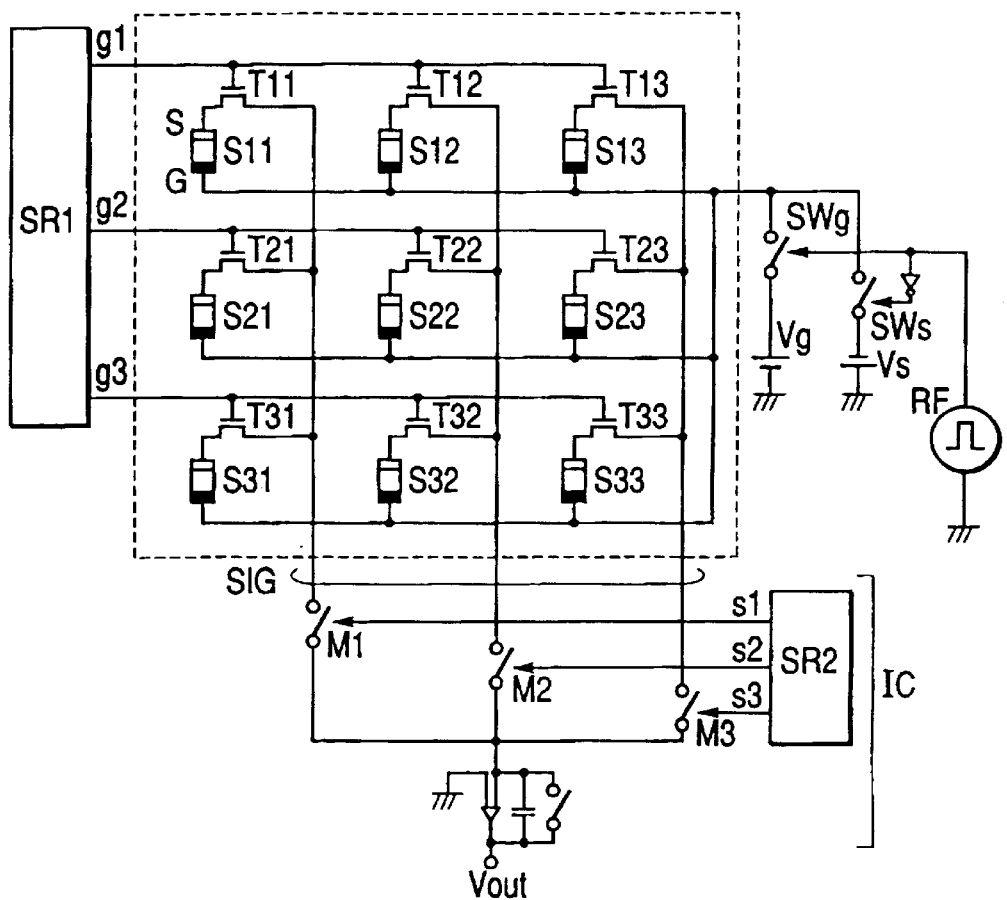
FIG. 16 is a circuit diagram showing the entire circuit of the conventional image reading device and the image reading device of the present invention.
Figure 17:
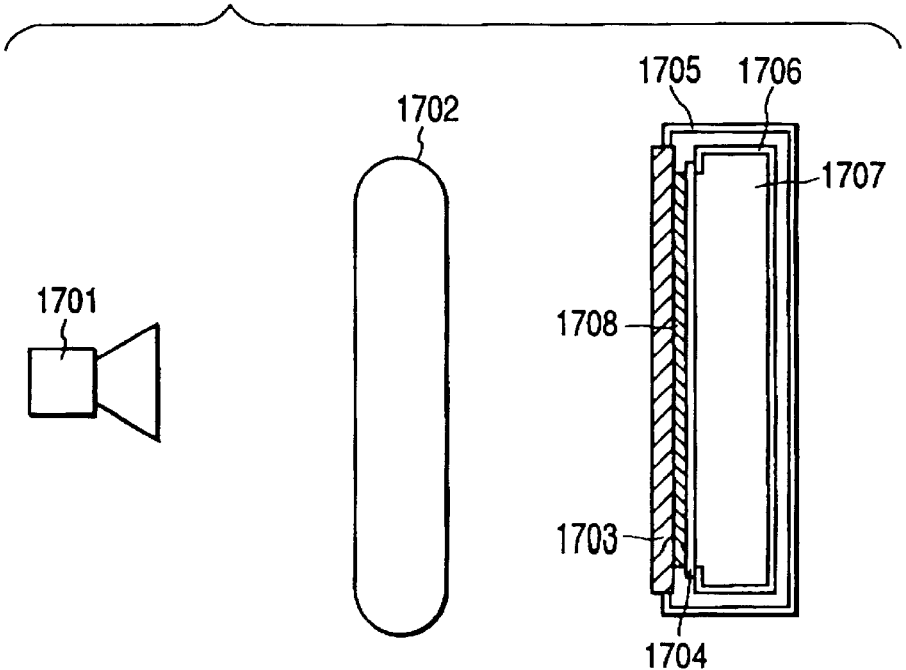
FIG. 17 is a schematic view showing an X-ray image pick-up apparatus in which the image reading device is used for X-ray image pick-up.

The optical crosstalk was compared similarly to Example 1 by employing the substrate of the present example in the actual image reading device. In FIG. 12, open circles (a) show the result of the present example, while black circles (b) show the result of Example 1. In the device of the present example, the light spreading is reduced and the output is lowered to 1% or less within about 10 pixels, similarly to Example 1.

As a result, the image reading device of excellent sharpness could be obtained in the present example.

Because all the light is absorbed in the base member, it is no longer necessary to consider the optical influence of the sensor substrate or the adhesive material for adhering the sensor substrate and the base member, so that the freedom of designing can be increased.

Also the present example allows to reduce the stray light in ideal manner without adopting a special light absorbing layer.

Also in the manufacturing process, the substrate itself serves as a light absorbing material, so that there is not required a step of reducing the stray light and the image reading device of a large area can be obtained without reducing the production yield by properly managing the substrate.

The present example employed the red-colored glass substrate because the fluorescent plate emitted green light. However, there can be employed any material for the substrate as long as it can fix the sensor substrate and it has a color complementary to the color of the light emitted by the fluorescent plate.

The present example is more effective in preventing the reflection, particularly by employing a base member having almost the same refractive index (including the same refractive index) as that of the sensor substrate or the adhesive material, thereby reducing (or completely eliminating) the reflection at the interface between the sensor substrate and the adhesive layer and the interface between the adhesive layer and the base member, in addition to the effect of the present example for preventing the reflection from the back surface of the base member. The glass substrate of a large area is expensive, but for example a black-colored heat-resistant plastic material can sufficiently exhibit the effect of the present invention and is also advantageous as a low-cost material. Additionally, the sensor substrate 503 used in the present example can be colored to obtain more effective antireflection effect.

EXAMPLE 3

Figure 6:
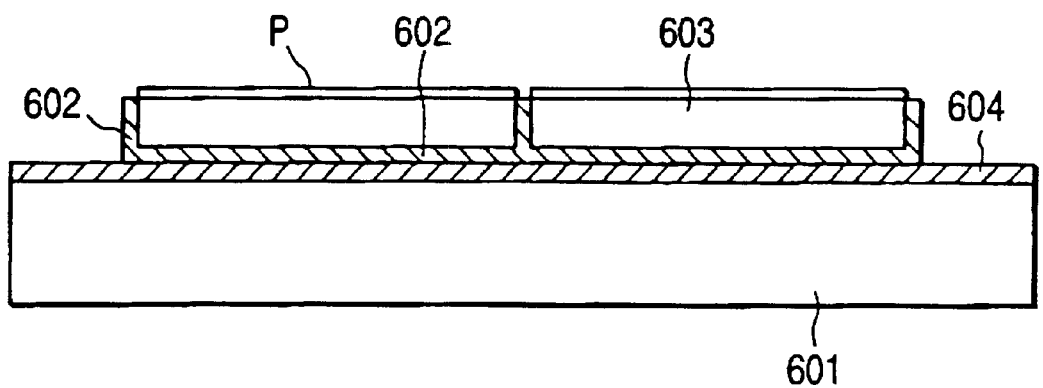
FIG. 6 is a cross-sectional view of Example 3 of the present invention.

FIG. 6 is a cross-sectional view of an image reading device of the present invention for use in an X-ray image pick-up apparatus. As be apparent from FIG. 6, the present example provides the image reading device of a larger area by placing a plurality of colorless transparent sensor substrates 603 on the same base member 601 similarly to Example 2, and the present example is to realize the effect of the present invention by the surface treatment of the base member 601.

The photosensors, thin film transistors and the like formed on the sensor substrate 603 are the same as in Example 1. The detection of radiation is achieved by the combination of a fluorescent plate and a photosensor. The X-ray entered from the exterior into the fluorescent plate P is converted into light therein and the light is detected by the photosensor.

The sensor substrate 603 was composed of low-alkali glass with a refractive index of 1.5.

The sensor substrate 603 and the base member 601 were mutually adhered with an epoxy based adhesive 602. The cured epoxy showed a refractive index of 1.4 to 1.6.

The base member 601 was composed of low-alkali glass of the same refractive index as that of the sensor substrate 603. The surface of the base member 601 was treated with acrylic-resin-based black paint 604.

At first a large-sized low-alkali glass plate was prepared and the surface thereof was sprayed with acrylic resin based black paint to form a coating thickness of about 30 $\mu$m. The coating film was dried for 24 hours, and glass substrates on which the photosensors, thin film transistors and the like were produced in advance were adhered on the glass. The process was simple and did not degrade the production yield of the sensor substrates themselves because the base member could be prepared separately from the sensor substrates.

Figure 8B:
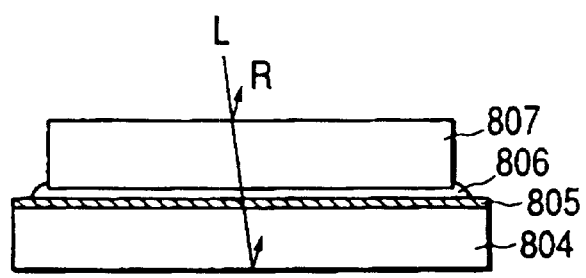

Similarly to the foregoing examples, there was conducted an experiment for confirming the effect of the present invention in the present example. FIG. 8B schematically shows the configuration employed for the experiment. The configuration consists of a glass substrate 807 serving as the sensor substrate, an adhesive layer 806, and a glass substrate serving as the base member 804 which has a black paint layer 805 on the surface thereof.

The fluorescent plate P in the present example was mainly composed of $Gd_2O_2S:Tl^{3+}$, which emitted the green light of a wavelength $\lambda$=550 nm. In the present example, the surface treatment was executed with a black paint containing a coloring material absorbing at least green light (having complementary color of green).

Figure 10:
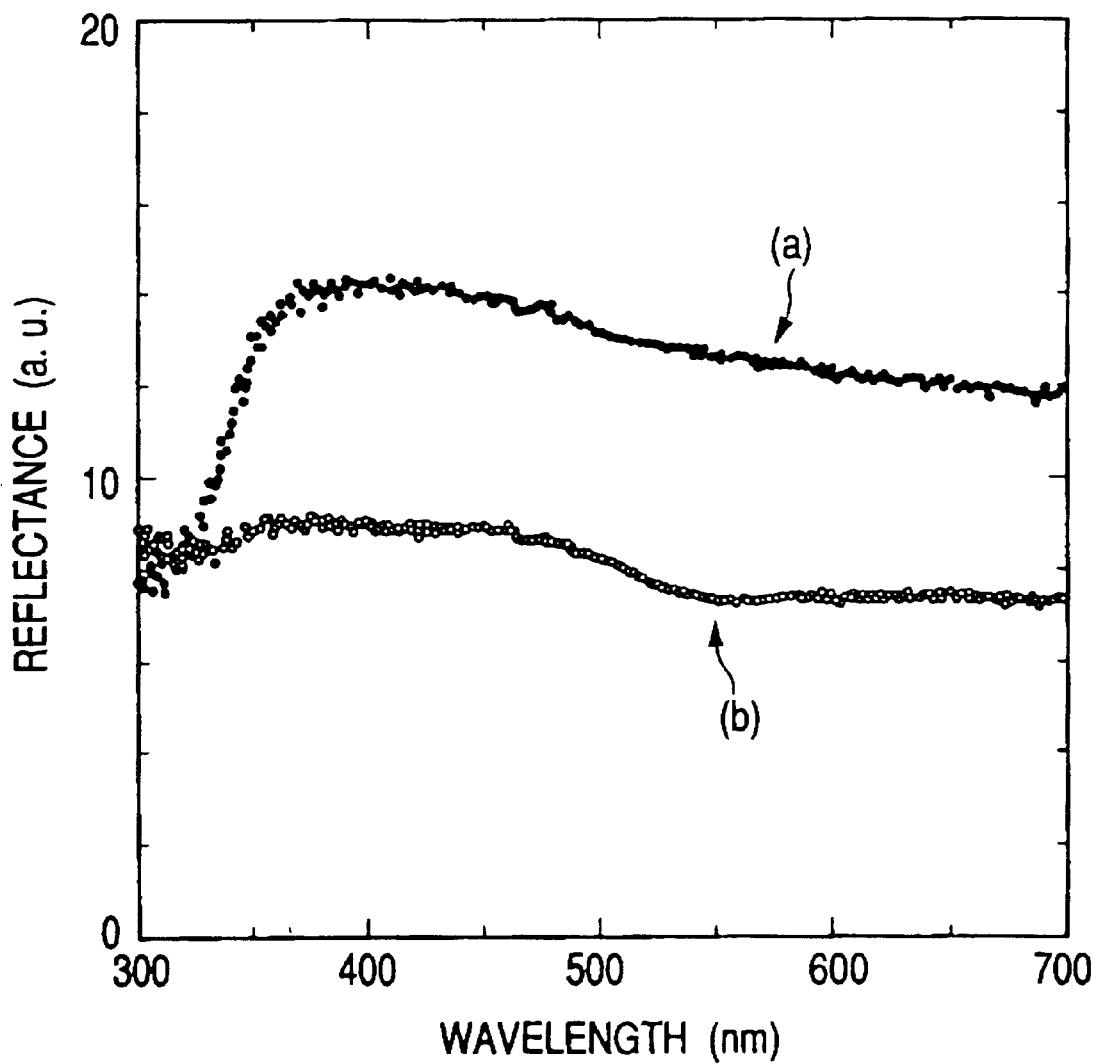
FIG. 10 is a reflectance-wavelength characteristic graph showing the result in the experimental system shown in FIG. 8B.

The base member was composed of glass having a surface experimentally coated with the black paint or ordinary glass, and the effect was confirmed by measuring the spectral sensitivity of a magnitude of the normal reflectance of light at the side of the sensor substrate with respect to the incident light. FIG. 10 is a reflectance-wavelength characteristic graph, in which black circles (a) show the case of using the ordinary glass, while open circles (b) show the case of using the glass with a surface coated with the black paint.

In the case with the black paint, the light of 700 nm or less is almost absorbed, so that there is almost no reflection on the back surface of the glass substrate 804.

In the present example, use of the base member composed of the glass substrate coated with the black paint causes the black paint provided on the surface of the base member to absorb the green light entering in the sensor substrate which has the peak at 550 nm, thereby suppressing the reflection on the back surface (second interface) of the base member.

The substrate of the present example could be utilized in the actual image reading device to obtain an image reading device of excellent sharpness without optical crosstalk.

Because the black paint coated on the base member absorbs all the incoming light, the designing can be achieved without considering the optical influence of the base member or the adhesive material adhering the sensor substrate and the base member, so that the freedom of designing can be increased.

Also in the manufacturing process, by providing the base member with a function of preventing the stray light, there is not required a step of reducing the stray light on the sensor substrate, thereby not making the process of sensor formation complicate and not reducing the production yield. The image reading device of a high performance and a large area can be produced at a low cost by properly managing the base member.

The present example employs the base member with the black-colored surface treating material in order to absorb the green light emitted from the fluorescent plate, but there can be employed any material for the base member as long as it can fix the sensor substrate and it has a surface treating material with a color complementary to at least the color of the light emitted by the fluorescent plate.

The present example is more effective in preventing the reflection, particularly by employing the sensor substrate, adhesive material and surface treatment layer of almost the same refractive index (including the same refractive index), thereby reducing (or completely eliminating) the reflection at the interface between the sensor substrate and the adhesive layer or the interface between the adhesive layer and the surface treatment layer, in addition to the effect of the present example for preventing the reflection from the back surface of the base member. The glass substrate of a large area is expensive, but for example when a heat-resistant plastic material is used as the base member and the surface is treated with red or black acrylic-resin-based paint, the effect of the present invention can be sufficiently exhibited and the coated base member is therefore advantageous as a low-cost material. Additionally, the sensor substrate 603 used in the present example can be colored to obtain more effective antireflection effect.

EXAMPLE 4

Figure 7:
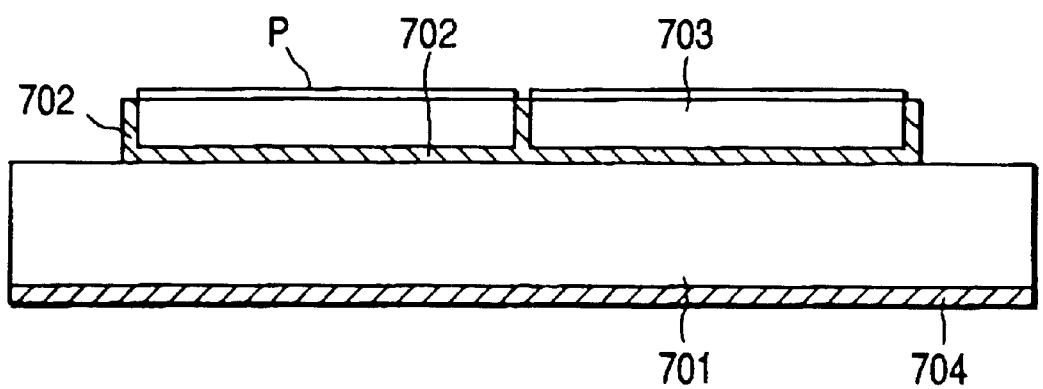
FIG. 7 is a cross-sectional view of Example 4 of the present invention.

FIG. 7 is a cross-sectional view of an image reading device of the present invention for use in an X-ray image pick-up apparatus. As be apparent from FIG. 7, the present example provides the image reading device of a larger area by placing a plurality of colorless transparent sensor substrates 703 on the same base member 701 basically in the same manner as in Example 2. The present example is to realize the effect of the present invention by treating the back surface of the base member 701.

The photosensors, thin film transistors and the like formed on the sensor substrate 703 are the same as in Example 1. The detection of radiation is achieved by the combination of a fluorescent plate and a photosensor. The X-ray entering from the exterior into the fluorescent plate P is converted into light therein and the light is detected by the photosensor.

The sensor substrate 703 was composed of low-alkali glass with a refractive index of 1.5.

The sensor substrate 703 and the base member 701 were mutually adhered with an epoxy-based adhesive 702, which had a refractive index of 1.4 to 1.6 after curing.

The base member 701 was composed of low-alkali glass of the same refractive index as that of the sensor substrate 703. The back surface of the base member 701 was spray coated with an acrylic-resin-based black paint to form a coating film with a thickness of about 30 $\mu$m. The coating film was dried for 24 hours, and glass substrates on which the photosensors, thin film transistors and the like were prepared in advance were adhered thereon. The process was simple and did not degrade the production yield of the sensor substrates themselves because the base member could be prepared separately from the sensor substrates.

Figure 8C:
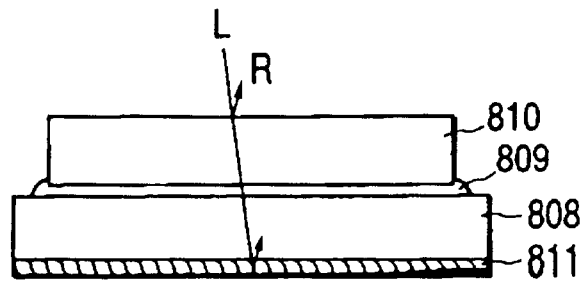

Similarly to the foregoing examples, there was conducted an experiment for confirming the effect of the present invention in the present example. FIG. 8C schematically shows the configuration employed for the experiment. The configuration consists of a glass substrate 810 serving as the sensor substrate, an adhesive layer 809, and a glass substrate 808 serving as the base member which has a black paint layer 811 as the back surface thereof.

The fluorescent plate P in the present example was mainly composed of $Gd_2O_2S:Tl^{3+}$, which emitted the green light of a wavelength $\lambda$=550 nm. In the present example, the back surface treatment was executed with a black paint containing a coloring material absorbing at least green light (having complementary color of green).

Figure 11:
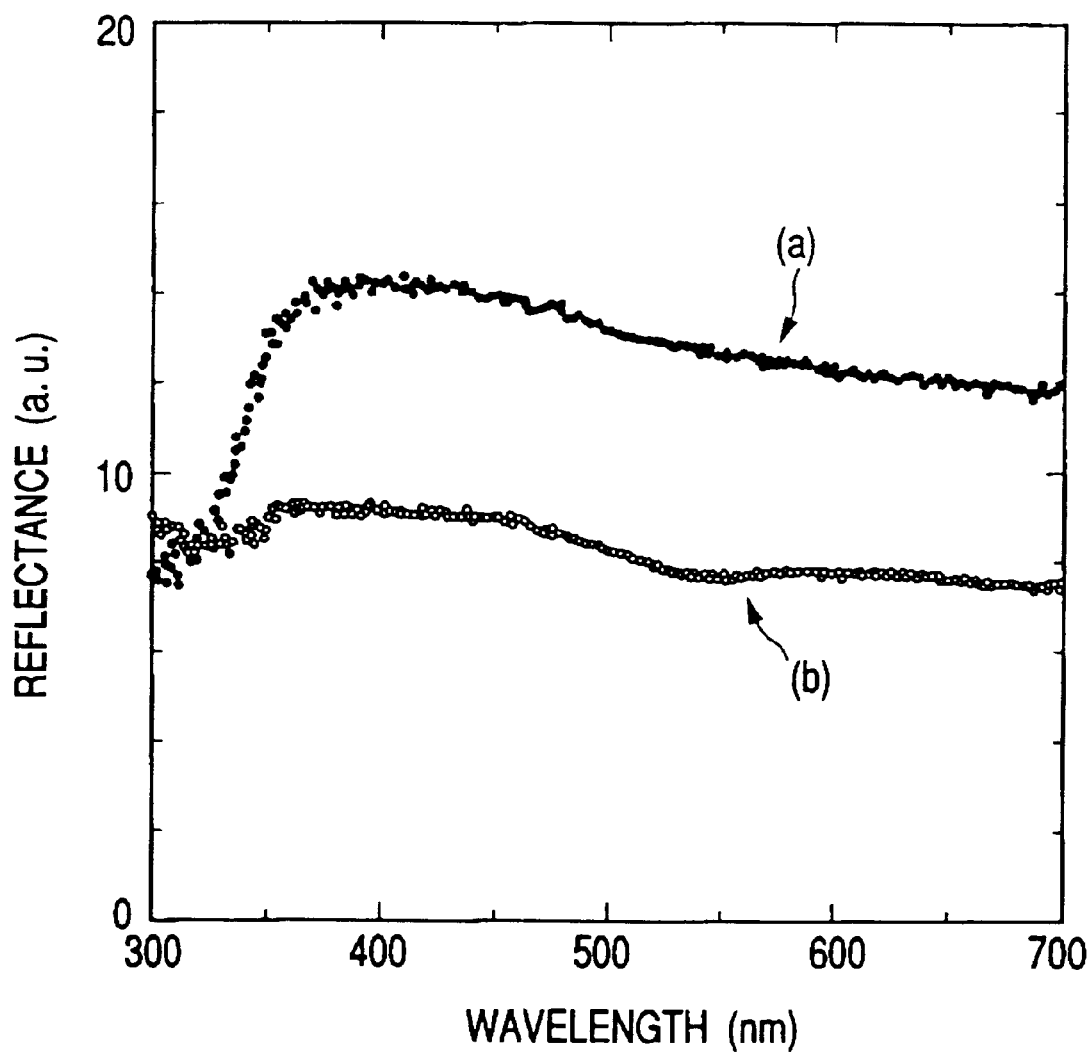
FIG. 11 is a reflectance-wavelength characteristic graph showing the result in the experimental system shown in FIG. 8C.

The base member was composed of glass having the back surface experimentally coated with the black paint or ordinary glass, and the effect was confirmed by measuring the spectral sensitivity of a magnitude of the normal reflectance of light at the side of the sensor substrate with respect to the incident light. FIG. 11 is a reflectance-wavelength characteristic graph, in which black circles (a) show the case of using the ordinary glass, while open circles (b) show the case of using the glass having the back surface coated with the black paint.

In the case of coating the back surface of the glass with the black paint, the light of 700 nm or less is almost absorbed, so that there is almost no reflection on the back surface of the glass substrate.

In the present example, use of the base member composed of the glass substrate having the back surface coated with the black paint causes the black paint on the back surface of the base member to absorb the green light entered in the sensor substrate which has the peak at 550 nm, thereby suppressing the reflection on the back surface (second interface) of the base member.

The substrate of the present example could be utilized in the actual image reading device to produce an image reading device of excellent sharpness without optical crosstalk.

Because the black paint applied onto the back surface of the base member absorbs all the incoming light, the designing can be achieved without considering the optical influence of the base member or the adhesive material adhering the sensor substrate and the base member, so that the freedom of designing can be increased.

Also in the manufacturing process, because the base member itself is provided with the absorbing member, there is not required a step of reducing the stray light on the sensor substrate, and the image reading device of a large area can be produced at a low cost by properly managing the base member.

The present example employs the base member with the black-colored back surface treating material in order to absorb the green light emitted from the fluorescent plate, but there can be employed any material for the base member as long as it can fix the sensor substrate and it has the back surface treating material with a color complementary to at least the color of the light emitted by the fluorescent plate. There can be employed a red-colored material for the green light similarly to Example 1 or 2.

The present example is more effective in preventing the reflection, particularly by employing the sensor substrate, adhesive material and surface treatment layer of almost the same refractive index (including the same refractive index), thereby reducing (or completely eliminating) the reflection at the interface between the sensor substrate and the adhesive layer, the interface between the adhesive layer and the base member or the interface between the base member and the back surface treatment layer, in addition to the effect of the present example for preventing the reflection from the back surface of the base member. The glass substrate of a large area is expensive, but for example a base member composed of heat-resistant plastic material and having the back surface treated with a red or black acrylic resin based paint can sufficiently exhibit the effect of the present invention and is therefore advantageous as a low-cost material. Additionally, at least one of the sensor substrate 703 and the base member 701 used in the present example can be colored to enhance the antireflection effect.

As explained in the foregoing, the present invention could solve the problem resulting from the presence of an interface between the sensor substrate and the air by substantially eliminating such interface, thereby avoiding the reflection at such interface. Also, according to the constitution of the present invention for substantially eliminating the interface, it is possible to obtain the image reading device of a high performance and a large area in a simple manufacturing process without reducing the production yield.

What is claimed is:

1. A radiation image pick-up apparatus comprising a fluorescent member for wavelength-converting radiation, and a sensor substrate comprising a plurality of photoelectric conversion elements formed thereon for detecting wavelength-converted light, wherein the sensor substrate is composed of a material capable of absorbing the light wavelength-converted by the fluorescent member which enters the sensor substrate and is not received by the photoelectric conversion elements.

2. A radiation image pick-up apparatus comprising a fluorescent member for wavelength-converting radiation, a sensor substrate comprising a plurality of photoelectric conversion elements formed thereon for detecting wavelength converted light and a base member adhered to the sensor substrate via an adhesive layer, wherein the base member is composed of a material capable of absorbing the light wavelength-converted by the fluorescent member which transmits through the sensor substrate.

3. A radiation image pick-up apparatus comprising a fluorescent member for wavelength-converting radiation, a sensor substrate comprising a plurality of photoelectric conversion elements formed thereon for detecting wavelength converted light and a base member adhered to the sensor substrate via an adhesive layer, wherein the base member is provided with, on a surface to be adhered to the sensor substrate, an absorbing layer composed of a material capable of absorbing the light wavelength-converted by the fluorescent member which transmits through the sensor substrate, and wherein the sensor substrate, the adhesive layer and the absorbing layer have substantially the same refractive index.

4. A radiation image pick-up apparatus comprising a fluorescent member for wavelength-converting radiation, a sensor substrate comprising a plurality of photoelectric conversion elements formed thereon for detecting wavelength converted light and a base member adhered to the sensor substrate via an adhesive layer, wherein the base member is provided with, on a surface of the base member at a side opposite to a side of the base member adhered to the sensor substrate, an absorbing layer composed of a material capable of absorbing the light wavelength-converted by the fluorescent member which transmits through the sensor substrate and the base member, and wherein the sensor substrate, the adhesive layer and the base member have substantially the same refractive index.

5. A radiation image pick-up apparatus according to claim 2, wherein the sensor substrate, the adhesive layer and the base member have substantially the same refractive index.

6. A radiation image pick-up apparatus according to any one of claims 1 to 5,
wherein the photoelectric conversion element is formed by stacking a first electrode layer, a first insulating layer for inhibiting passage of carriers of a first conductivity type and carriers of a second conductivity type different from the first conductivity type, a photoelectric conversion semiconductor layer, a second electrode layer, and an injection inhibiting layer for inhibiting injection of the carriers of the first conductivity type into the photoelectric conversion semiconductor layer, the injection inhibiting layer being provided between the second electrode layer and the photoelectric conversion semiconductor layer;
wherein switching means to be respectively connected to the photoelectric conversion elements are formed on the sensor substrate together with the photoelectric conversion elements;

wherein the switching means in a refreshing operation provide the photoelectric conversion elements with an electric field in a direction of guiding the carriers of the first conductivity type from the photoelectric conversion semiconductor layer to the second electrode layer, and the switching means in a photoelectric converting operation provide the photoelectric conversion elements with an electric filed in a direction of retaining the carriers of the first conductivity type generated by the light entering the photoelectric conversion semiconductor layer, in the photoelectric conversion semiconductor layer, and of guiding the carriers of the second conductivity type to the second electrode layer, the switching means being controlled by the photoelectric conversion operation so as to detect, as optical signals, the carriers of the first conductivity type accumulated in the photoelectric conversion semiconductor layer or the carriers of the second conductivity type guided to the second electrode layer; and the plurality of photoelectric conversion elements are arranged two-dimensionally and are divided into a plurality of blocks, and the switching means are operated for each of the blocks to detect the optical signals.

* * * * *

UNITED STATES PATENT AND TRADEMARK OFFICE
CERTIFICATE OF CORRECTION

PATENT NO. : 6,501,062 B2
DATED : December 31, 2002
INVENTOR(S) : Kazuaki Tashiro It is certified that error appears in the above-identified patent and that said Letters Patent is hereby corrected as shown below:

Column 2,
Line 10, "but in the fact" should read -- in fact --;
Line 14, "Qf" should read -- of --; and
Line 51, "sponding." should read -- sponding --.

Column 3,
Line 14, "reading." should read -- reading --.

Column 7,
Line 8, "same" should read -- the same --; and
Line 43, "As be" should read -- As is --.

Column 8,
Line 40, "As be" should read -- As is --.

Column 10,
Line 40, "As be" should read -- As is --.

Column 11,
Line 51, "complicate" should read -- complicated --.

Column 12,
Line 18, "As be" should read -- As is --.

UNITED STATES PATENT AND TRADEMARK OFFICE
CERTIFICATE OF CORRECTION

PATENT NO. : 6,501,062 B2
DATED : December 31, 2002
INVENTOR(S) : Kazuaki Tashiro It is certified that error appears in the above-identified patent and that said Letters Patent is hereby corrected as shown below:

<u>Column 15,</u>
Line 8, "filed" should read -- field --.

Signed and Sealed this

Fifteenth Day of July, 2003

JAMES E. ROGAN
*Director of the United States Patent and Trademark Office*